(12) United States Patent
Doyle

(10) Patent No.: US 7,834,629 B2
(45) Date of Patent: Nov. 16, 2010

(54) HYBRID MRI AND METHOD

(75) Inventor: Mark Doyle, Wexford, PA (US)

(73) Assignee: Allegheny-Singer Research Institute, Pittsburgh, PA (US)

( * ) Notice: Subject to any disclaimer, the term of this patent is extended or adjusted under 35 U.S.C. 154(b) by 0 days.

(21) Appl. No.: 12/283,396

(22) Filed: Sep. 11, 2008

(65) Prior Publication Data

US 2010/0060281 A1   Mar. 11, 2010

(51) Int. Cl.
*G01V 3/00*   (2006.01)

(52) U.S. Cl. .................... 324/318; 324/319

(58) Field of Classification Search ............. 324/318, 324/319, 321
See application file for complete search history.

(56) References Cited

U.S. PATENT DOCUMENTS

| 4,310,799 | A | * | 1/1982 | Hutchison et al. | 324/319 |
| 4,727,327 | A | * | 2/1988 | Toyoshima et al. | 324/309 |
| 4,829,252 | A | * | 5/1989 | Kaufman | 324/309 |
| 5,305,749 | A | * | 4/1994 | Li et al. | 600/415 |

* cited by examiner

*Primary Examiner*—Louis M Arana
(74) *Attorney, Agent, or Firm*—Pepper Hamilton LLP

(57) ABSTRACT

An MRI includes a cylindrical housing having a long axis in which a patient is positioned essentially in parallel with the long axis of the cylindrical housing. The MRI includes an electromagnetic receiver coil system positioned about a cylindrical housing and aligned with the long axis of the cylindrical housing. The MRI includes an electromagnetic imaging gradients coil system positioned about the cylindrical housing and aligned with the long axis of the cylindrical housing. The MRI includes a main magnet having its north pole and south pole positioned about the housing, which produces a magnetic field through the housing perpendicular to the long axis of the cylindrical housing. A method for examining a patient.

6 Claims, 6 Drawing Sheets

HYBRID MRI AND METHOD

FIELD OF THE INVENTION

The present invention is related to an MRI having an electromagnetic receiver coil system and an electromagnetic imaging gradients coil system positioned about the cylindrical housing and aligned with the long axis of a cylindrical housing. (As used herein, references to the "present invention" or "invention" relate to exemplary embodiments and not necessarily to every embodiment encompassed by the appended claims.) More specifically, the present invention is related to an MRI having an electromagnetic receiver coil system and an electromagnetic imaging gradients coil system positioned about the cylindrical housing and aligned with the long axis of a cylindrical housing where the imaging gradients coil system applies imaging gradients and radio frequency transmission pulses to the patient, and the electromagnetic receiver coil system receives the pulses.

BACKGROUND OF THE INVENTION

This section is intended to introduce the reader to various aspects of the art that may be related to various aspects of the present invention. The following discussion is intended to provide information to facilitate a better understanding of the present invention. Accordingly, it should be understood that statements in the following discussion are to be read in this light, and not as admissions of prior art.

Conventionally, MRI systems can be broadly assigned to two main categories: 1) "open" systems and 2) "cylindrical bore" systems. In brief, the cylindrical systems are based on a tube like structure, with the patient inserted into the tube, with the imaging gradients constructed on the cylindrical surface such that they closely surround the patient, only leaving open the front and back of the system, FIG. 1A. FIGS. 1a-1c show MRI scanner designs with the patient's long axis represented by the solid arrow and the main magnetic field direction represented by the open arrow. FIG. 1a shows cylindrical magnet, with the patient positioned within the cylinder. Note that patient's long axis and main magnetic field are parallel to each other. FIG. 1b shows an open system, with the north pole and south pole of the magnet above and below the patient (or equivalently, side to side), with the patient laying horizontally and the field directed vertically (i.e. patient's long axis and magnetic field are orthogonal). FIG. 1c shows the hybrid system, with the vertical (or equivalently, side to side) magnetic field of the open system and with the patient positioned within a cylindrical structure such that the patient's long axis is orthogonal to the main magnetic field. The imaging gradients are constructed on the cylindrical surface. Conversely, the open systems often employ a vertically oriented magnetic field, with the imaging gradients built into the structures above and below the patient table, leaving the sides of the system open in that there are no structures to either side or to the front or back, allowing open patient access, FIG. 1b. The location of the gradient coils in each of these structures affects their relative performance, with the open systems suffering from generally poor performance gradients, while the gradients in the cylindrical systems are generally more efficient. The gradient performance affects two aspects of the images obtained, with the high performance gradients allowing images to be obtained faster and with reduced artifacts. Additionally, the relative orientation of the patient to the main magnetic field also affects image quality: 1) the open systems orient the patient orthogonally to the main magnetic field (FIG. 1b), which allows for a more efficient design of the receiver coil system, effectively increasing the SNR; whereas 2) the cylindrical systems orient the patient's long axis parallel to the main magnetic field (FIG. 1a), which compromises the design of the receiver coil, effectively reducing the SNR compared to that which is optimally obtainable from a system with a matching magnetic field strength.

Consider the configuration of a conventional horizontal-bore, cylindrical design MRI system in FIGS. 2a-2c. FIGS. 2a-2c show the position and form of gradient and receiver coils relative to the patient for conventional cylindrical MRI system. FIG. 2a panel shows the gradient coils with windings located on the curved surface of a cylinder, while the receiver coils (gray shading) are drawn as circular coils positioned immediately above and below the patient. FIG. 2b shows the gradient coils wound on the curved cylindrical surface, efficiently encompassing the volume around the patient, while FIG. 2c shows that the receiver coils only have windings above and below the patient volume, leading to a low winding density over the patient body region of interest. The gradient coils are wound on the curved surface of a cylindrical former that completely surrounds the patient. This geometry produces a relatively high density of coil windings around the patient, while encompassing the relatively small volume (i.e. there is typically very little free space between the patient and the coil windings). This accomplished two design advantages, 1) the high density of coil windings can generate high magnetic gradients with easily achievable current levels, and 2) the small volume enclosed by the coils keeps the coils' inductances low, which facilitates rapid switching of the gradients. The main disadvantageous feature of this design is the inefficiency with which signals are received. In FIGS. 2a-2c, the receiver coil is represented as two circular coils, one positioned above and one below the supine patient. This can be thought of as two coils, one on each face of the flat poles of a cylinder, the long axis of which traverses through the patient (i.e. orthogonal to the patient's long axis). In reality, the top and lower coils may be curved slightly to better conform to the patient's body, and there are typically more than two coils. However, the design principle is similar, in that the coils are essentially limited to two surfaces, producing a low density of coil windings over the body region of interest. This low density of windings in the receiver coil results in low sensitivity to signal.

When considering the conventional open MRI system, with a vertical field relative to the horizontal patient (FIGS. 3a-3c), the relative density of gradient and receiver coil windings are reversed. FIGS. 3a-3c show the position and form of gradient and receiver coils relative to patient for conventional open MRI system. FIG. 3a shows the gradient coil with windings located on flat surfaces of the magnet pole pieces, while the receiver coil (gray shading) is drawn as a cylindrical coil fully encompassing the patient body region of interest (the thorax and abdomen in this example). FIG. 3b shows the gradient coils wound on the flat ends of the magnetic pole pieces, encompassing the volume around the patient with a relatively sparse winding density over the patient region, while FIG. 3c shows that the receiver coil only has windings wound on the curved cylindrical surface which efficiently surrounds the patient volume with a high density of windings. In the vertical field magnet the gradient coils are wound on the flat surfaces (represented as a cylinder in this case) producing a sparse winding density over the body region, and consequently the gradients are weak for typical currents that are available. Additionally, the volume enclosed by the (imaginary) cylinder that encompasses the patient region occupies a large volume, leading to high inductance for each coil, making the gradients slow to switch. These two conditions lead to relatively poor performance specifications for these imaging systems. In contrast, the receiver coil can be efficiently wound on the cylindrical surface of a cylinder (encompassing a patient body region such as the thorax), yielding a high winding density over the body region of interest, with consequent high sensitivity to signal reception.

Thus, it can be appreciated that the configuration of the cylindrical and open systems compromises either the design of the gradient system or the signal receiver system. The present invention (Hybrid Vertical-Horizontal MRI System) combines the advantageous aspects of these two designs.

BRIEF SUMMARY OF THE INVENTION

The present invention pertains to an MRI. The MRI comprises a cylindrical housing having a long axis in which a patient is positioned essentially in parallel with the long axis of the cylindrical housing. The MRI comprises an electromagnetic receiver coil system positioned about the cylindrical housing and aligned with the long axis of the cylindrical housing. The MRI comprises an electromagnetic imaging gradients coil system positioned about the cylindrical housing and aligned with the long axis of the cylindrical housing. The MRI comprises a main magnet having its north pole and south pole positioned about the housing, which produces a magnetic field through the housing, perpendicular to the long axis of the cylindrical housing.

The present invention pertains to a method for examining a patient. The method comprises the steps of switching an electromagnetic imaging gradient coil system to apply imaging gradients and radio frequency transition pulses to the patient. The electromagnetic imaging gradient coil system is positioned about a cylindrical housing having a long axis in which the patient is positioned essentially in parallel with the long axis of the cylindrical housing. The patient is located in a magnetic field produced by a main magnet having its north pole and south pole positioned about the housing, which produces a magnetic field through the housing perpendicular to the long axis of the cylindrical housing. There is the step of receiving the pulses at an electromagnetic receiver coil system positioned about the body region of the patient and aligned with the long axis of the cylindrical housing to obtain k-space data.

The invention involves configuring the gradient and receiver coil systems of an MRI relative to the main magnetic field to efficiently obtain high signal to noise ratio images with high-performance gradients.

BRIEF DESCRIPTION OF THE SEVERAL VIEWS OF THE DRAWING

In the accompanying drawings, the preferred embodiment of the invention and preferred methods of practicing the invention are illustrated in which.

DETAILED DESCRIPTION OF THE INVENTION

Figure 4A:
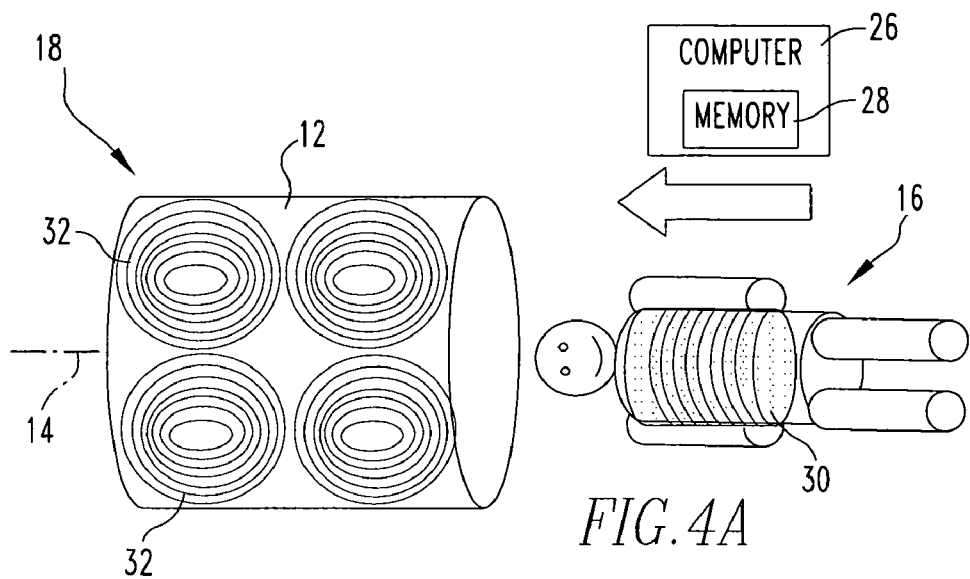
FIGS. 4a-4c show the position and form of gradient and receiver coils 30 relative to patient for hybrid vertical-horizontal MRI 10 system.
Figure 4B:
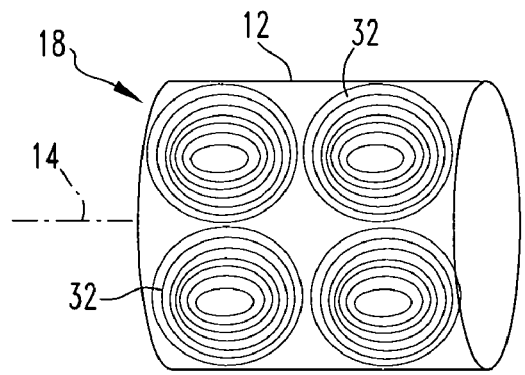
Figure 4C:
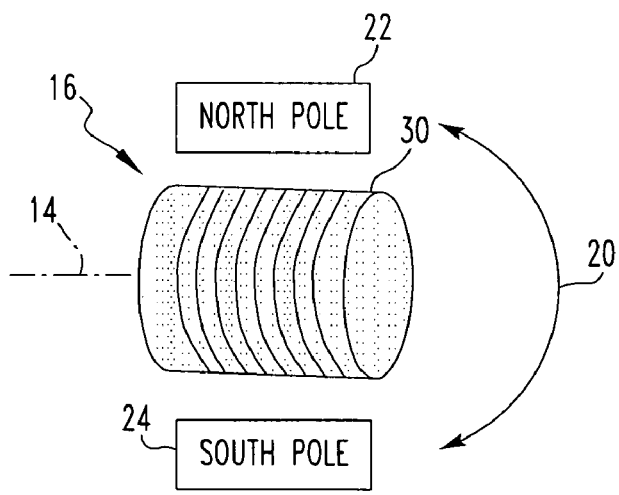

Referring now to the drawings wherein like reference numerals refer to similar or identical parts throughout the several views, and more specifically to FIGS. 4a-4c thereof, there is shown an MRI 10. The MRI 10 comprises a cylindrical housing 12 having a long axis 14 in which a patient is positioned essentially in parallel with the long axis 14 of the cylindrical housing 12. The MRI 10 comprises an electromagnetic receiver coil system 16 positioned about the cylindrical housing 12 and aligned with the long axis 14 of the cylindrical housing 12. The MRI 10 comprises an electromagnetic imaging gradients coil system 18 positioned about the cylindrical housing 12 and aligned with the long axis 14 of the cylindrical housing 12. The MRI 10 comprises a main magnet 20 having its north pole 22 and south pole 24 positioned about the housing 12, which produces a magnetic field through the housing 12 perpendicular to the long axis 14 of the cylindrical housing 12.

Preferably, the MRI 10 includes a computer 26 which causes the imaging coil system to apply imaging gradients and radio frequency transmission pulses to the patient to obtain k-space data and which converts electrical voltage signal information from the receiver coil system 16 into digital values which are stored in arrays within a memory 28 of the computer 26 along with information of which k-space lines were acquired. The receiver coil system 16 preferably has receiver coils 30 and the gradient coil system has gradient coils 32 which are wound on the housing's 12 curved surface. Preferably, the gradient coils 32 are etched in copper having a cylindrical form. The receiver coils 30 are preferably wound copper wire either as a multi-turn, single solenoid or as a series of individual coils, each coil contributing to a respective receiver channel. Preferably, the magnet 20 which is either a permanent or electromagnet, with flat pole pieces corresponding to the north pole 22 and south pole 24.

The present invention pertains to a method for examining a patient. The method comprises the steps of switching an electromagnetic imaging gradient coil system to apply imaging gradients and radio frequency transition pulses to the patient. The electromagnetic imaging gradient coil system is positioned about a cylindrical housing 12 having a long axis 14 in which the patient is positioned essentially in parallel with the long axis 14 of the cylindrical housing 12. The patient is located in a magnetic field produced by a main magnet 20 having its north pole 22 and south pole 24 positioned about the housing 12, which produces a magnetic field through the housing 12 perpendicular to the long axis 14 of the cylindrical housing 12. There is the step of receiving the pulses at an electromagnetic receiver coil system 16 positioned about the body region of the patient and aligned with the long axis 14 of the cylindrical housing 12 to obtain k-space data.

Preferably, there is the step of converting electrical voltage signal information from the detector coil system into digital values which are stored in arrays within a memory 28 of a computer 26 along with information of which k-space lines were acquired.

Figure 1C:
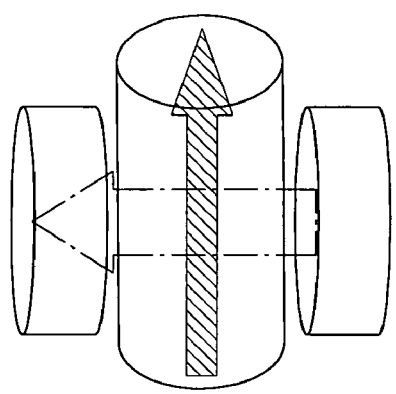
FIGS. 1a-1c show MRI scanner designs with the patient's long axis represented by the solid arrow and the main magnetic field direction represented by the open arrow.
Figure 1B:
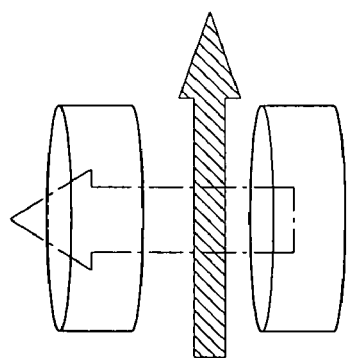
Figure 1A:
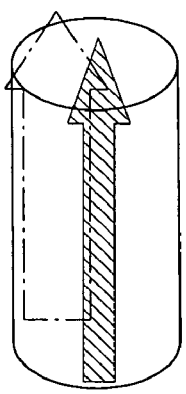
Figure 2A:
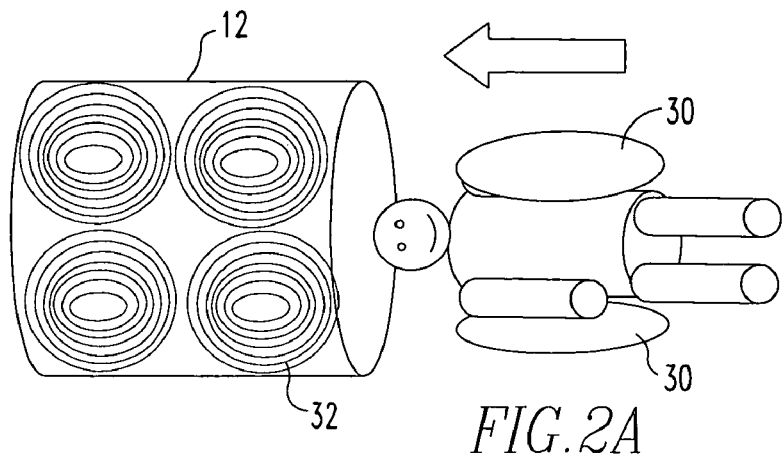
FIGS. 2a-2c show the position and form of gradient and receiver coils relative to the patient for conventional cylindrical MRI system.
Figure 2B:
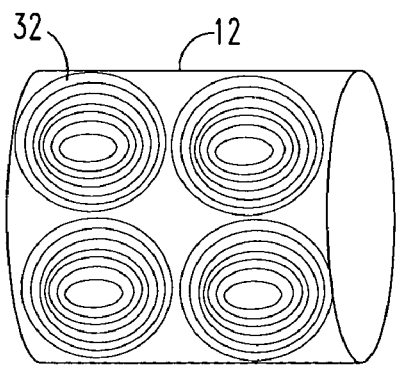
Figure 2C:
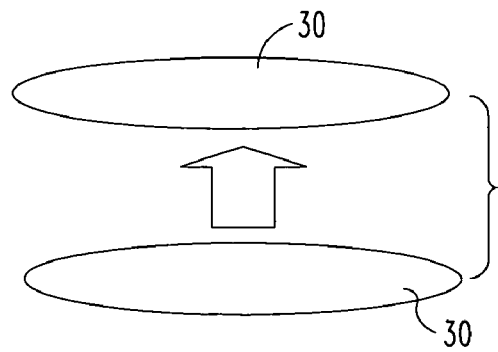
Figure 3A:
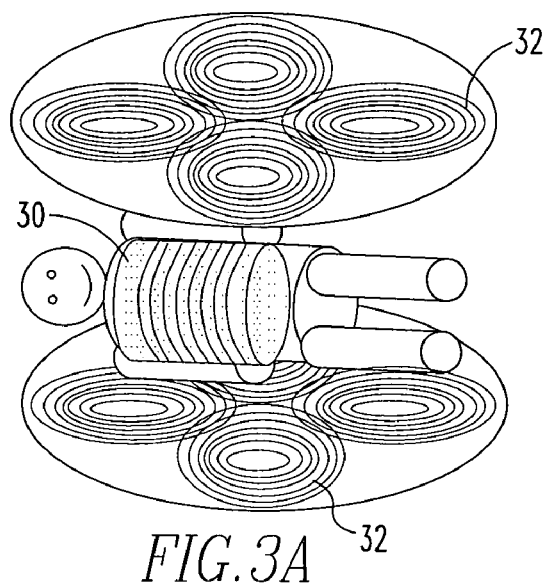
FIGS. 3a-3c show the position and form of gradient and receiver coils relative to patient for conventional open MRI system.
Figure 3B:
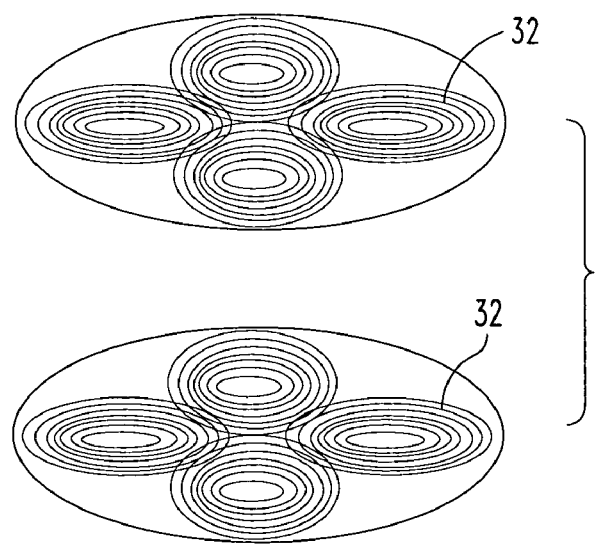
Figure 3C:
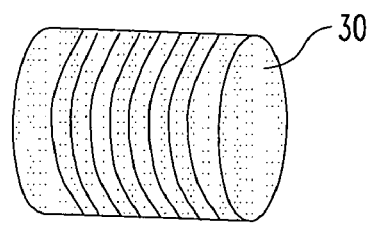

In the operation of the invention, the main magnet 20 and receiver coil systems 16 are based on the design most suitable for an open MRI 10, while the gradient is designed based on a cylindrical geometry (FIG. 1C). To appreciate the design characteristics of the hybrid Vertical-Horizontal system, knowledge of two physical principles are required: 1) The signal emitted by the patient in an MRI 10 system originates with a magnetic spin that generates a dynamic magnetic field oriented perpendicular to the main magnetic field. This dynamic field is sensed by an electromagnet coil which is sensitive to magnetic fields aligned with at least one axis of the signal source (i.e. perpendicular to the main magnetic field). 2) One of the most efficient designs for an electromagnet coil is to distribute the windings over a cylindrical surface. Thus, by orienting the magnetic field direction perpendicular to the patient's long axis 14, it is possible to surround the patient with an electromagnetic receiver coil system based on the efficient cylindrical geometry, making the system inherently highly sensitive to signal. Additionally, the imaging gradients (typically consisting of three orthogonal gradients) can be efficiently designed on a cylindrical surface, since this surface conforms to a geometry that closely matches the body and which allows minimization of the volume enclosed by each gradient coil, making them inherently efficient (as coil inductance is reduced when the volume enclosed by the coils is reduced). The key features of the hybrid system are a magnetic field oriented perpendicular to the long axis 14 of the body, while the gradient and receiver coil systems 16 of the scanner are based on a cylindrical geometry. This design feature gives the scanner system inherent design advantages in two areas: 1) signal is received with a higher SNR compared to comparable cylindrical systems (exact values cannot be given but in practical open design systems, it is estimated that this configuration yields an increased signal of about 30%); and 2) by designing the primary imaging gradient coils 32 on a cylindrical surface in close proximity to the body, gradients can perform at increased efficiency (again, exact values cannot be given, but in practical systems, the gradient performance of cylindrical vs. open systems are about 100% stronger and 300% faster in establishing the gradient. Typical gradient strengths and slew rates for cylindrical systems are 40 mT/m and 140 mT/m/ms, respectively, while corresponding values for open systems are 20 mT/m and 30 mT/m/ms.

The hybrid vertical-horizontal system arranges for both the gradient and receiver coils 30 to be wound on the curved surfaces of concentric or even co-incident cylinders, each aligned with the long axis 14 of the body, as shown in FIGS. 4a-4c. FIGS. 4a-4c show the position and form of gradient and receiver coils 30 relative to patient for hybrid vertical-horizontal MRI 10 system. FIG. 4a shows the gradient coils 32 with windings located on curved surfaces of a cylinder, and the receiver coil (gray shading) is also drawn as a cylindrical coil fully encompassing the patient body region of interest (the thorax and abdomen in this example). FIG. 4b shows the gradient coil wound on the curved surface of a cylinder, encompassing the volume around the patient with a relatively high density of windings over the patient, and FIG. 4c shows that receiver coil is also wound on a curved cylindrical surface that efficiently surrounds the patient volume with a high density of windings. In this case, a high density of windings are achieved for both the gradients and the receiver coil(s), producing conditions that allow strong gradients to be switched rapidly and signal to be received with high signal-to-noise ratio. In the example of FIGS. 4a-4c, the three orthogonal gradients (X, Y, and Z) are wound on the curved surface of a cylinder, and are drawn to represent the commonly used distributed gradient design, i.e. where windings are distributed over the majority of the cylindrical surface instead of being highly concentrated in a narrow region. Further, the receiver coil is represented as a multi-turn solenoid that fits over the thorax and abdomen in this example. The physical construction of the distributed gradient coils 32 is typically achieved by photographically etching the gradients in copper in the form of a cylinder. The solenoidal receiver coil can be wound using copper wire, either as a multi-turn, single solenoid, as represented here, or as a series of individual coils (each of a limited number of turns) each contributing to a separate receiver channel.

For the hybrid vertical-horizontal magnet 20, construction could be of a permanent or electromagnetic design, typically with flat pole pieces corresponding to north pole 22 and south pole 24. The patient is positioned on a surface such that the field is directed through the patient's body along the chest to back or left to right direction, and not along the head to feet direction. The computer 26 control system required to synchronize the switching of gradients, the transmission of radio-frequency energy and the reception of signal can be of a conventional design that is commonly used in existing systems.

The invention could allow MRI 10 systems to become more efficient, since the system combines both efficient signal reception and gradient generation. Commercially this could translate to a relatively low cost system, as the cost of two major components can be reduced: 1) a lower main magnetic field strength can be used to obtain adequate SNR (in general the system cost diminishes linearly with field strength), and 2) with the efficient design of the gradient coils 32, low-power amplifiers would be sufficient to generate the required gradients, again, a factor that reduces system cost. Optionally, the cylindrical tube design of the gradient subsystem could be sealed at each end by adding end-caps made of a wire mesh, and could reduce the need for a separate Faraday screened room (to shield the system from radio waves), which would further reduce siting costs of the system.

Figure 5A:
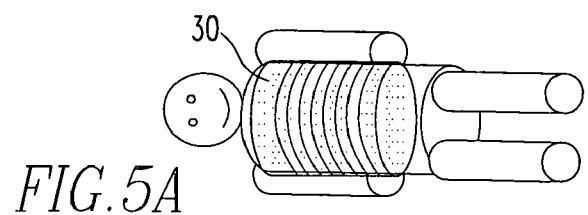
FIGS. 5a-5e show various configurations of the solenoidal receiver coil(s), with the receiver coil positioned around the thorax, the head, an arm, a leg and even encompassing the whole body, respectively.
Figure 5B:
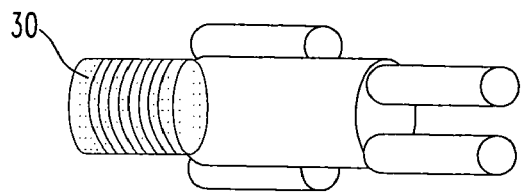
Figure 5C:
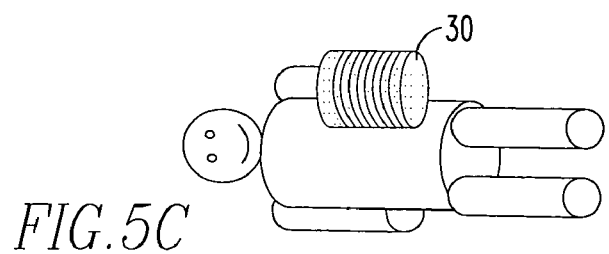
Figure 5D:
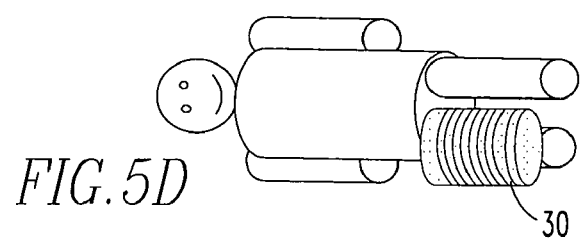
Figure 5E:
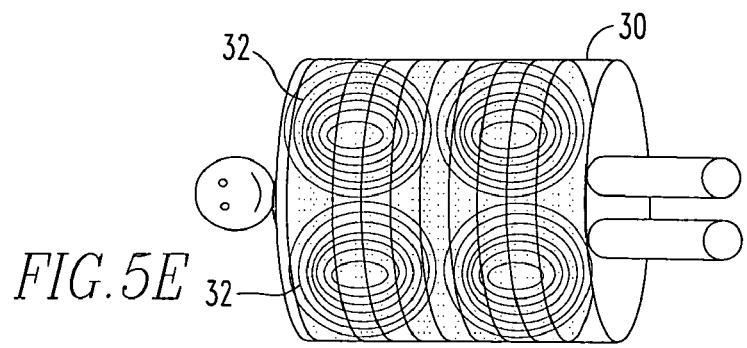

FIGS. 5a-5e show various configurations of the solenoidal receiver coil(s), with the receiver coil positioned around the thorax, the head, an arm, a leg and even encompassing the whole body, respectively. For individual body regions, the axis of the solenoidal receiver coil is parallel to the cylindrical former on which the gradient coils are wound. In FIG. 5e, the solenoidal coil is wound on the same surface as the gradient coils and the two axes are not only parallel but are coincident. The cylindrical design of the receiver coils system allows for efficient reception of signal. As shown in FIGS. 5a-5e, the design of the solenoidal receiver coil 30 can be close fitting to a body region such as the thorax, the head, or limbs, or alternatively encompassing the whole body in a solenoidal coil 30 wound coincident with the gradient coils 32. In the case of locally positioned coils, the important design features are 1) that the main axis of the coil is parallel to the main axis of the cylindrical coil on which the gradients are wound, and 2) by being physically close to the body region of interest, the signal reception is high. In the last example in FIG. 5e, the solenoidal receiver coil 30 is positioned on the same surface as the gradient coils 32. In this case, the main axes of the receiver and gradient coils are coincident. This design of receiver coil allows for ease of patient set up, and is suitable for whole body signal reception.

Figure 6:
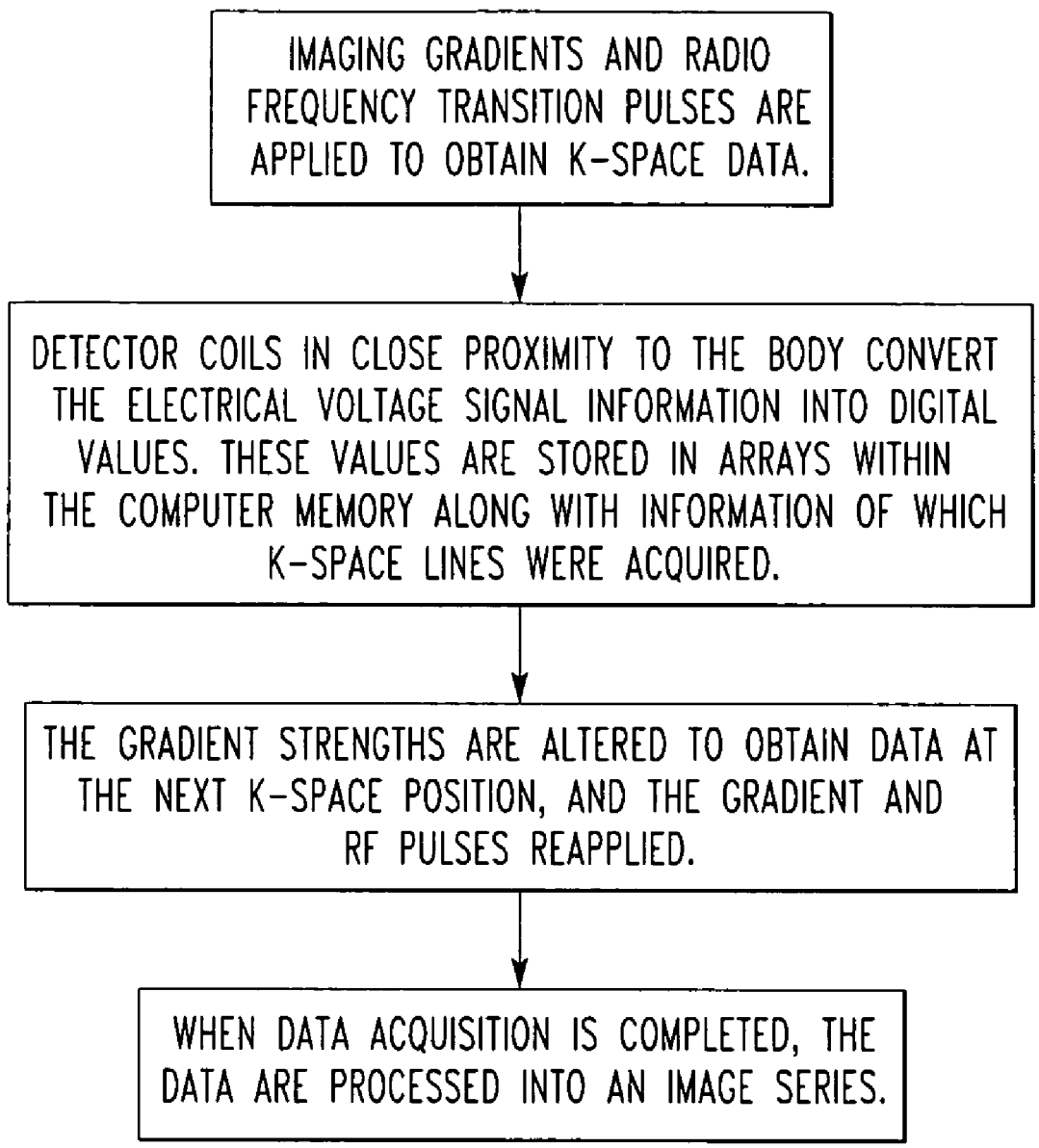
FIG. 6 is a flow chart regarding the MRI.

FIG. 6 is a flow chart regarding the MRI 10.

Although the invention has been described in detail in the foregoing embodiments for the purpose of illustration, it is to be understood that such detail is solely for that purpose and that variations can be made therein by those skilled in the art without departing from the spirit and scope of the invention except as it may be described by the following claims.

The invention claimed is:
1. An MRI comprising
a cylindrical housing having a long axis in which a patient is positioned essentially in parallel with the long axis of the cylindrical housing;
an electromagnetic receiver coil system disposed within the housing, separate and apart from the housing and aligned with the long axis of the cylindrical housing;
an electromagnetic imaging gradients coil system positioned about the cylindrical housing and aligned with the long axis of the cylindrical housing; and
a main magnet having its north pole and south pole positioned about the housing, which produces a magnetic field through the housing perpendicular to the long axis of the cylindrical housing.

2. An MRI as described in claim 1 wherein the receiver coil system has receiver coils and the gradient coil system has gradient coils which are wound on the housing's curved surface.

3. An MRI as described in claim 2 wherein the gradient coils are etched in copper having a cylindrical form.

4. An MRI as described in claim 3 wherein the receiver coils are wound copper wire either as a multi-turn, single solenoid or as a series of individual coils, each coil contributing to a respective receiver channel.

5. An MRI as described in claim 4 wherein the magnet which is either a permanent or electromagnet, with pole pieces corresponding to the north pole and south pole.

6. A method for examining a patient comprising the steps of:
switching an electromagnetic imaging gradient coil system to apply imaging gradients and radio frequency transition pulses to the patient, the electromagnetic imaging gradient coil system positioned about a cylindrical housing having a long axis in which the patient is positioned essentially in parallel with the long axis of the cylindrical housing, the patient located in a magnetic field produced by a main magnet having its north pole and south pole positioned about the housing, which produces a magnetic field through the housing perpendicular to the long axis of the cylindrical housing; and
receiving the pulses at an electromagnetic receiver coil system positioned about the body region of the patient, disposed inside the housing, separate and apart from the housing and aligned with the long axis of the cylindrical housing to obtain k-space data.

* * * * *